Nov. 19, 1974 C. H. McMURTRY ET AL 3,849,344
SOLID DIFFUSION SOURCES CONTAINING PHOSPHORUS AND SILICON
Filed March 31, 1972
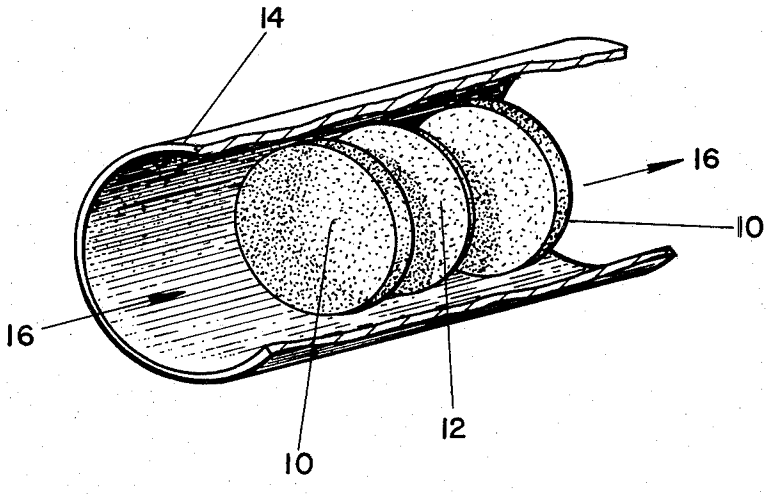

United States Patent Office 3,849,344
Patented Nov. 19, 1974

3,849,344

SOLID DIFFUSION SOURCES CONTAINING PHOSPHORUS AND SILICON

Carl H. McMurtry, Lewiston, and Yorihiro Murata, North Tonawanda, N.Y., assignors to The Carborundum Company, Niagara Falls, N.Y.

Filed Mar. 31, 1972, Ser. No. 239,897
Int. Cl. B32b *5/04;* H01b *1/04*
U.S. Cl. 252—500 3 Claims

ABSTRACT OF THE DISCLOSURE

New solid diffusion sources for the phosphorus doping of semiconductor silicon are made from compositions comprising 5–100 wt. percent phosphorus compounds and 0–95 wt. percent silicon containing additives by hot-pressing or cold-pressing and sintering techniques. The phosphorus compounds are reaction products of phosphorus and silicon oxides, with compositions approximating $SiO_2 \cdot P_2O_5$, $2SiO_2 \cdot P_2O_5$ or $SiO_2 \cdot 2P_2O_5$. The silicon containing additives are silicon nitride, silica and silicon metal. The typical diffusion source developed was a thin slice, about one inch in diameter and 25 to 45 mils thick, made from a hot-pressed body composed of 30% of one of the phosphorus compounds and 70% $Si_3N_4$, the hot-pressing conditions being 1200° C. at 2600 p.s.i., for 30 minutes in argon atmosphere. This source exhibited an excellent doping ability and had a long lifetime of doping effectiveness. The doping method using these sources is simple, reliable, safe and economical compared to conventional liquid doping methods.

BACKGROUND OF THE INVENTION

In the manufacture of semiconductor devices such as microwave transistors and silicon integrated circuits, shallow phosphorus diffusion in semiconductor silicon has become important. The characterization of semiconductor bodies is influenced substantially by diffusion profiles, especially from the emitter of a n-p-n structure, and the profiles are further dependent upon the diffusion source used. Up to the present time, liquid diffusion sources have been utilized in the diffusion process since no satisfactory solid phosphorus diffusion sources have been available. The liquid sources which have been employed are compounds such as phosphine ($PH_3$), phosphorus pentoxide ($P_2O_5$), phosphorus oxychloride ($POCl_3$) and phosphorus chlorides ($PCl_3$ and $PCl_5$). Of these liquid sources, $POCl_3$ and $PH_3$ have most frequently been used. These five phosphorus compounds are all low melting-point substances and are in liquid or gas phases at temperatures below 650° C.

Conventional doping methods for phosphorus diffusion as performed with liquid diffusion sources are briefly as follows. One of the compounds listed above is heated at a low temperature, below 600° C., and the phosphorus gas and/or phosphorus compound gas thus developed are introduced in a doping chamber kept at a high temperature ranging from 850° C. to 1200° C. In this chamber the silicon wafers to be doped are arranged parallel to the phosphorus gas flow. In this method, the carrier concentration of phosphorus, p-n junction depth, and other electronic properties of the doped wafer are primarily influenced by the reaction condition between phosphorus gas and the solid silicon wafer. This reaction is further influenced by the flow of gas. When a uniform diffusion layer is required, a uniform flow of gas is necessary and this is quite difficult to establish. As a result, uniform diffusion of phosphorus in terms of each silicon wafer is difficult to control. This is one of shortcomings of the conventional phosphorus doping method using liquid diffusion sources. Another deficiency of the liquid diffusion source method is inconvenience due to the dangerous materials of the liquid sources. Phosphine, phosphorus oxychloride and many other phosphorus compounds are toxic, corrosive, flammable or explosive.

While liquid diffusion sources continue to be used for the treatment or doping of semiconductor materials, the disadvantages of irregular diffusion control and high toxicity must be overcome to give a satisfactory diffusion procedure. An effective phosphorus diffusion or doping procedure for semiconductor silicon should provide; (1) a shallow phosphorus doping in silicon which is necessary to produce microwave transistors and modern silicon integrated circuits; (2) the doping procedure should not be complicated and should have a high reproducibility and reliability; (3) the doping procedure should be safe, even if personnel are exposed to exhaust gas during doping; and, (4) the solid diffusion sources should be economically reusable for many doping runs. The invention therefore provides compositions which are formed into solid diffusion sources. The sources of the invention are nontoxic and may be used in standard diffusion apparatus to give a more precise control of the diffusion treatment of semiconductor materials. These solid sources are convenient to use and are effective over extended periods of time during service. The advantages of the invention are further described in the following drawings and detailed description.

SUMMARY OF THE INVENTION

The invention pertains to a semiconductor doping composition which comprises compounds of phosphorus and silicon as well as other silicon containing materials. A preferred composition comprises about 30 wt. percent of a compound of phosphorus and silicon and about 70 wt. percent of silicon nitride. The composition is formed into suitable solid diffusion sources by hot pressing techniques or by cold forming, followed by sintering. Pressures ranging from 750 to 35,000 p.s.i. and temperatures ranging from 800 to 1500° C. are employed to form the solid diffusion sources of the invention. These, when cut into suitable shapes, give easily handled and economical solid sources of phosphorus for the diffusion treatment and doping of silicon semiconductor bodies.

DESCRIPTION OF THE DRAWINGS

FIG. 1 is a cross section of a diffusion chamber, showing the position of the diffusion sources in relation to the treated semiconductor material.

DETAILED DESCRIPTION OF THE INVENTION

The solid phosphorus containing diffusion sources of the invention are used, preferably, in the form of thin circular discs. These discs are made from a suitable hot-pressed or sintered body, using known methods, such as diamond sawing, to cut the discs to the desired thickness and diameter. The body comprises one or more compounds of phosphorus and silicon and may also comprise silicon containing materials such as silicon nitride, silica, or silicon metal. Suitable compounds of phosphorus and silicon are reaction products of phosphorus and silicon oxides with compositions approximating $SiO_2 \cdot P_2O_5$, $2SiO_2 \cdot P_2O_5$ or $SiO_2 \cdot 2P_2O_5$; these may be used in both crystalline and amorphous phases. Glasses containing phosphorus and having compositions of about 98 wt. percent silica and about 2 wt. percent $P_2O_5$ may also be used. The diffusion sources of the invention may comprise from about 5 to 100 wt. percent of one or more of the phosphorus-silicon compositions and about 0–95 wt. percent of silicon nitride, silica or silicon metal.

The bodies of diffusion material of the invention may be fabricated in graphite molds, using hot-pressing techniques. Fabrication may be done at temperatures ranging from about 800 to 1450° C. and under pressures ranging from about 750 to 5500 p.s.i. Holding times in the molds may range from about 15 minutes to 10 hours and the fabrication may be carried out in air, under inert atmospheres such as nitrogen or argon, or under vacuums up to $10^{-7}$ Torr. An alternate means of fabrication for the bodies of diffusion material is by a cold forming and sintering method. In this method the body is cold formed in a mold under pressures ranging from about 5000 to 35,000 p.s.i., folowing by sintering the molded body without pressure at temperatures ranging from about 800 to 1500° C. Sintering times may range from about 30 minutes up to 12 hours and may be carried out under the same atmospheres as those described for hot pressing. The choice of fabrication conditions is governed by the composition of the starting materials used and the conditions under which the resulting diffusion material will be used.

Solid diffusion sources which demonstrated the best diffusion characteristics were those containing reaction products of phosphorus and silicon oxides with compositions approximating $SiO_2 \cdot P_2O_5$, $2SiO_2 \cdot P_2O_5$ or $SiO_2 \cdot 2P_2O_5$ mixed with silicon nitride. Preferred compositions were in the range of about 30 to 100 wt. percent of the phosphorus-silicon compounds and about 70–0 wt. percent of silicon nitride. Satisfatcory diffusion characteristics were also obtained from compositions containing about 70 wt. percent of a phosphorus-silicon compound and about 30 wt. percent silica, as well as compositions containing about 70 wt. percent of a phosphorus-silicon compound and about 30 wt. percent of silicon metal. The phosphorus-silicon compounds were prepared by the thermal reaction of dihydrogen ammonium phosphate, $NH_4H_2PO_4$, with silicic acid, $2SiO_2 \cdot H_2O$. The phosphorus content of the resulting reaction products was controlled by changing the relative proportions of starting materials to give reaction products with compositions approximating $SiO_2 \cdot P_2O_5$, $2SiO_2 \cdot P_2O_5$ or $SiO_2 \cdot 2P_2O_5$. The preparation of one of tese products and the fabrication into a phosphorus diffusion source is described in the following examples:

Example 1

The first phosphorus-silicon reaction product, with a chemical formula approximating $SiO_2 \cdot P_2O_5$, was synthesized from a mixture of dihydrogen ammonium phosphate, $NH_4H_2PO_4$, and silicic acid, $2SiO_2 \cdot H_2O$. Both chemicals were reagent grade powder and were dry mixed for about 30 minutes using a porcelain mill jar with flint stones. The total amount of this mixture was 2666 grams and the batch composition corresponded to the composition of 50 mole percent $SiO_2$ and 50 mole percent $P_2O_5$.

The intimate dry mixture thus prepared was poured loosely into a fused silica vessel and the vessel then heated slowly to 700° C. at a heating rate of 100° C./hour in air, using a Globar® electrical heating furnace; no cover was placed on the vessel due to gas evolution during heating. At 700° C., the temperature was held constant for 12 hours. During heating gas and smoke were developed from the chemical reaction between ammonium phosphate and silicic acid. At the end of this holding time, the smoking had almost ceased, indicating the completion of the chemical reaction for the formation of the desired product.

After cooling, the fired material was removed and dry crushed into a powder which passed through a 50 mesh Tyler sieve. The weight of this fine powder was 1660 grams; it was then put back into the fused silica vessel, and the vessel heated to 1250° C./hour in air in the same furnace previously used. After reaching 1250° C., the temperature was kept constant for 2 hours, after which the furnace was shut off and the vessel allowed to cool to room temperature in the furnace. The total weight of the product obtained by firing at 1250° C. was 1310 grams. This was crushed into grains of approximately 1/16 inch diameter using a jaw crusher, and these grains were then further dry crushed into a fine powder which passed through a 100 mesh silk screen. An X-ray diffraction analysis of the fine powder thus obtained indicated it to be a high temperature phase of the compound $SiO_2 \cdot P_2O_5$.

Two firing steps were required, since after firing at 700° C. the mixture expanded to some extent due to an extensive reaction so that a harder crust was formed at the surface of the mixture, the chemical composition of the crust was then different from that of the interior. To make a uniform mixture, the cake obtained by firing at 700° C. was crushed into a powder and in the second firing at 1250° C., very little crust was formed and a relatively dense and uniform cake was obtained. In the second firing, a crystal transformation from the low temperature phase to the high temperature phase apparently took place. In other words, the first firing is responsible for the formation of a phosphorus-silicon compound, approximating $SiO_2 \cdot P_2O_5$, with an extensive reaction of raw materials, and the second firing is responsible for the transformation of the crystal structure from the low temperature phase to the high temperature phase. Through these two-step firings, a satisfactory product having the high temperature phase was obtained. When only one firing was made the resulting product was unsatisfactory.

When the final firing temperature was 1300° C. instead of 1250° C., the material thus fired was an amorphous glass. This glass had essentially the same chemical composition as that of the crystalline form obtained at 1250° C., the phosphorus content of the glass product being approximately the same as that of the crystalline, i.e. 22.3%. Both of these products were excellent phosphorus sources for making subsequent phosphorus diffusion or doping materials. Other phosphorus-silicon compounds with compositions approximating $2SiO_2 \cdot P_2O_5$ and $SiO_2 \cdot 2P_2O_5$, as well as a silica glass containing phosphorus, were prepared under conditions similar to those described in Example 1. Reaction conditions and product properties are summarized in Table 1.

TABLE 1.—SYNTHESIS CONDITIONS AND PROPERTIES OF PHOSPHORUS-SILICON COMPOUNDS

| Compound | $SiO_2 \cdot P_2O_5$ | $2SiO_2 \cdot P_2O_5$ | Silica glass | $SiO_2 \cdot 2P_2O_5$ |
|---|---|---|---|---|
| Chemical comp. (wt. percent): | | | | |
| $SiO_2$ | 29.73 | 45.8 | 98.0 | 17.5 |
| $P_2O_5$ | 70.27 | 54.2 | 2.0 | 82.5 |
| Raw materials (grams): | | | | |
| DAP [2] | 2,050 | 1,580 | 54 | 2,408 |
| SA [2] | 616 | 950 | 2,031 | 362 |
| Total | 2,666 | 2,530 | 2,085 | 2,770 |
| First firing: | | | | |
| Temp. (° C.) | 700 | 700 | 800 | 700 |
| Time (hr.) | 12 | 12 | 12 | 12 |
| Second firing: | | | | |
| Temp. (° C.) | 1,250 | 1,100 | 1,400 | 1,200 |
| Time (hr.) | 2 | 2 | 2 | 2 |
| Heating rate (° C./hr.) | 200 | 200 | 200 | 200 |
| True density (g./cc.) | 2.70 | 2.42 | 2.21 | 2.68 |
| Melting point (° C.) | 1,290 | 1,150 | 1,520 | 1,200 |
| Phosphorus content, wt. percent | 22.3 | 17.8 | 3.9 | 19.5 |
| Yield (grams) | 1,306.3 | 1,282.7 | 1,159.5 | 1,011.3 |

[1] Dihydrogen ammonium phosphate, $NH_4H_2PO_4$.
[2] Silicic acid, $2SiO_2 \cdot H_2O$.

The compounds shown above are stable at temperatures up to about 1200° C. without melting, this thermal stability being essential for the development of the present solid diffusion sources of the invention. Phosphorus compounds previously used, such as $P_2O_5$, $PCl_5$ and $P_3N_5$ are not stable at elevated temperatures above 1000° C., and either melt or decompose. Since phosphorus diffusion or doping should be performed at relatively high temperatures, ranging from 850° C. to 1200° C., the solid source should be stable at a high temperature of at least 1000° C. The solid diffusion sources of the invention adequately fulfill this requirement. One method of making a hot-pressed diffusion source is described as follows.

Example 2

Using the fine powder of phosphorus-silicon compound as synthesized in Example 1, solid diffusion sources were fabricated by a hot-pressing technique. In this fabrication 34.8 grams of the powder was placed in a graphite mold, 1 inch inner diameter, 4 inches outside diameter and 6 inches high and the graphite mold thus prepared was heated slowly to 1050° C. in a high frequency induction furnace, with a heating rate of approximately 10° C./minute. A pressure of 2600 p.s.i. was applied throughout the hot-pressing process from room temperature to 1050° C., and was released after thermal soaking for 30 minutes at 1050° C. The mold was cooled in the furnace to room temperature, producing a body of about 1 inch diameter and 1¼ inches thickness. The bulk density of this hot-pressed body was 2.25 g./cc. which corresponds to 83.5% of the theoretical density of 2.70 g./cc. The body was white and exhibited no cracks or segregation. Solid diffusion sources, which are thin circular discs, 1 inch in diameter and about 30 mils thick, were made by slicing the hot-pressed body using a high speed diamond sawing machine. Six circular discs were usually made from the hot-pressed body. The slices had adequate strength for handling in the subsequent doping procedure as well as machining.

Besides the 100% phosphorus-silicon compound hot-pressed diffusion source, diffusion sources composed of the binary compound systems, i.e., phosphorus-silicon plus additive, where the additives are silicon nitride, silica, and silicon metal, were made. Of these combinations, those containing silicon nitrides were extensively investigated and were the compositions preferred for reliability and feasibility of doping performance. In this system, the silicon nitride used was a high purity fine powder of the beta form. The chemical purity of this powder was 99.8 wt. percent and the average particle size determined microscopically was 3.5 microns. The fabrication method of diffusion sources from these compositions is described in the following example.

Example 3

A body composed of 30 wt. percent phosphorus-silicon compound (approx. $SiO_2 \cdot P_2O_5$) and 70 wt. percent silicon nitride was made from a mixture of 30 grams of powdered phosphorus-silicon compound and 70 grams of silicon nitride. This was mixed with methanol using a porcelain jar mill with flintstones and the mixture was then dried at 100° C. for 3 hours in air. The dried mixture was further dry mixed for 10 minutes in the jar mil to insure an intimate mixture of the components. About 41 grams of this dried mixture was hot-pressed at a temperature of 1200° C. under a pressure of 2600 p.s.i. where heating and cooling conditions and the graphite mold used were the same as those for the hot-pressing of the composition as described in Example 1.

From the above hot-pressing, a uniform body, about 1 inch diameter and 1¼ inches high, was obtained, and the bulk density of this body was 1.88 grams/cc. To examine the bulk density effect on the doping characteristic, a low density body with 1.29 grams/cc. was made by applying a low pressure of 1600 p.s.i. instead of 2600 p.s.i. during hot-pressing. Both low and high density bodies contained about the same phosphorus content of 9.5 wt. percent. It should be noted that these hot-pressed bodies thus made are uniform composites composed of fine particles of both components, where these two particles should not react with each other during hot-pressing at 1200° C. The plastic deformation of the particles and the mechanical interlocking between them result in the bond strength of a solid body. Hot-pressing temperature is critical for the determination of the subsequent doping temperature. The maximum doping temperature is generally lower than the hot-pressing temperature. The maximum hot-pressing temperature is also lower than the synthesis temperature of the phosphorus-silicon compound i.e., about 1250° C., so that the maximum processing temperature using the present systems is higher than the normal use temperature. From the hot-pressed bodies thin slices, approximately 1 inch in diameter and 30 mils thick, were made using a diamond sawing machine. The slices thus fabricated were highly satisfactory as diffusion sources for phosphorus doping.

Properties of hot-pressed bodies composed of a phosphorus-silicon compound approximating $SiO_2 \cdot P_2O_5$ and silicon nitride, silica and silicon metal are shown in Table 2. The bulk density is dependent upon the hot-pressing temperature applied, which was 1100° C. for compositions bearing 0 to 30 wt. percent additive and 1200° C. for compositions above 50 wt. percent additive. Phosphorus contents ranged from 22.3% to 1.2%. Concentrations of phosphorus, as low as 1.2%, in the resulting silicon containing wafers, were sufficient to give satisfactory performance as phosphorus diffusion sources, when doping conditions such as temperature and soaking time were adequately selected.

TABLE 2.—PROPERTIES OF HOT-PRESSED BODIES

[$SiO_2 \cdot P_2O_5 + Si_3N_4$, $SiO_2 \cdot P_2O_5 + SiO_2$ and $SiO_2 \cdot P_2O_5$+Si metal]

| Number | Composition, wt. percent | | Theoretical density, g./cc.[1] | Body wt., 1″ dia. x 1″ thickness gms.[2] | Bulk density, g./cc.[3] | Phosphorus content, wt. percent[4] | Hot-pressing temperature (° C.)[5] |
|---|---|---|---|---|---|---|---|
| | $SiO_2 \cdot P_2O_5$ | Additive | | | | | |
| 1 | 100 | 0 | 2.70 | 34.8 | 2.25 | 22.3 | 1,100 |
| 2 | 70 | 30 $Si_3N_4$ | 2.89 | 37.4 | 2.20 | 15.6 | 1,100 |
| 3 | 50 | 50 $Si_3N_4$ | 3.03 | 39.1 | 2.15 | 11.6 | 1,100 |
| 4 | 30 | 70 $Si_3N_4$ | 3.18 | 41.0 | 1.88 | 7.5 | 1,200 |
| 5 | 5 | 95 $Si_3N_4$ | 3.39 | 43.7 | 1.54 | 1.2 | 1,200 |
| 6 | 70 | 30 $SiO_2$ | 2.53 | 32.6 | 2.15 | 16.2 | 1,100 |
| 7 | 5 | 95 $SiO_2$ | 2.22 | 28.6 | 1.80 | 1.5 | 1,150 |
| 8 | 70 | 30 Si | 2.61 | 33.7 | 2.18 | 14.8 | 1,100 |
| 9 | 5 | 95 Si | 2.43 | 31.3 | 1.54 | 1.1 | 1,200 |

[1] Calculated from theoretical densities of $SiO_2 \cdot P_2O_5$ (2.70 g./cc.), $Si_3N_4$ (3.44 g./cc.), $SiO_2$ (2.20 g./cc.), and Si (2.40 g./cc.).
[2] The powder amount to be hot-pressed in a graphite mold, 1 inch diameter.
[3] Bulk density of the hot-pressed body.
[4] Phosphorus content in the hot-pressed body.
[5] Hot-pressing at 2,600 p.s.i. for 30 minutes in argon atmosphere.

As previously pointed out, diffusion sources of the invention may also be formed by a cold-forming operation, followed by sintering, as shown in the following examples.

Example 4

Forty grams of powdered phosphorus-silicon compound (200 mesh) was placed in a case-hardened metal mold, 1¼ inch diameter and 4 inches high, and then pressed at a static pressure of 20,000 p.s.i. using the double plunger method in which the pressure was applied from both ends of the plungers so as to establish uniform pressure distribution in the powder compact. After cold-pressing, the compact body had a bulk density of 1.32 g./cc. with a dimension of approximately 1¼ inches diameter and 1½ inches high. The compact body thus made was sintered at 1100° C. for 12 hours in air at a heating rate of 100° C./hr. After holding 12 hours at 1100° C., the compact was allowed to cool at room temperature in the furnace. The sintered body thus made exhibited 1.65 g./cc. as a mean bulk density with a dimension of approximately one inch diameter and 1¼ inches high. The sintered body was off-white and was strong enough to permit machining in a diamond sawing machine for making doping discs, about 1 inch in diameter and 30 mils thick.

Example 5

The sintered diffusion sources comprising binary compositions such as those of 30% phosphorus-silicon compounds and 70% silicon nitride, were made by adding 60 grams of powdered phosphorus-silicon compound (200 mesh) to 140 grams of silicon nitride powder (325 mesh sieve). This was mixed with methyl alcohol for 30 minutes in a rubber lined metal jar with flint stones. After mixing the intimate mixture thus made was dried at 110° C. for 8 hours in air, and the dried cake thus made was dry crushed into a fine powder, using the jar with flint stones mentioned above. Forty-three grams of the dry mixture was placed in a case-hardened metal mold and pressed at 20,000 p.s.i., using the double plunger method. After pressing the body exhibited a bulk density of 1.41 g./cc. with a dimension of approximately 1¼ inches diameter and 1½ inches high.

The pressed body thus made was sintered at 1200° C. for 12 hours in a nitrogen atmosphere at a heating rate of 100° C./hr. in a Globar® heating furnace. After sintering, the body was cooled to room temperature in the furnace. The sintered body exhibited 1.62 g./cc. mean bulk density with a dimension of about 1¼ inches diameter and 1½ inches high. The sintered body was grey and easily workable by diamond saw and machining into doping discs, 1 inch in diameter and 30 mils thick.

Sintered bodies comprising mixtures of phosphorus-silicon compounds and silica, as well as bodies comprising similar mixtures with silicon metal, were formed under conditions similar to those described for the bodies containing silicon nitride. While the bodies containing silica could be sintered in air, those containing silicon metal had to be sintered under an atmosphere of argon. Physical properties and phosphorus contents of sintered bodies formed from varying mixtures of the phosphorus-silicon compound approximating $SiO_2 \cdot P_2O_5$, with additives such as silicon nitride, silica and silicon metal are shown in Table 3.

limited to the use of this compound alone. Other compounds with compositions approximating $2SiO_2 \cdot P_2O_5$ or $SiO_2 \cdot 2P_2O_5$ may be substituted in the mixtures as described above to give satisfactory bodies for the phosphorus diffusion sources of the invention. The source bodies may be formed, not only by cold-pressing, but by other cold forming techniques such as isotactic pressing or by extrusion, cold casting or tape processing.

The doping method using the solid diffusion sources of the invention is as follows. The solid sources 10, about 1 inch diameter and 35 mils thick, are arranged parallel to silicon wafers 12 about 1 inch diameter and 10 mils thick, as shown in FIG. 1. Both silicon wafers 12 and diffusion elements 10 are arranged alternately with a spacing between them of about ⅛ inch. This assembly is placed in a high purity fused quartz tube 14, about 2 inches in diameter, and heated to temperature at which the phosphorus treatment or doping is achieved. The treating or doping temperatures usually range from 850° C. to 1200° C. and the holding time may range from 15 minutes to 60 minutes, depending upon the phosphorus diffusion profile and the carrier concentration of phosphorus which should be achieved in the silicon wafers after doping. Temperature and time are quite important in this process. Usually, higher temperatures and longer times result in so-called heavy doping. Since silicon metal has a melting point of 1420° C., temperatures above 1300° C. are not used in the doping procedure. The atmosphere in which the doping is performed is usually argon or nitrogen, this gas flow is shown by arrows 16.

The phosphorus containing solid diffusion sources of the invention were developed for use in either oxidizing or inert atmospheres and at temperatures up to 1200° C. without melting, subliming or excessive decomposition. The sources were made with four elements, Si, P, O, and N, where other elements, especially Group IA and IIA elements, were excluded. The sources must also have good mechanical strength since they are divided into very thin slices ranging from 25 to 45 mils. The body of source material as first made should resist mechanical vibration and stress during slicing and machining with high speed diamond sawing machines. This is a fabrication requirement but relates intimately to the strength of the material. Strength is improved by the addition of silicon compounds such as silicon nitride, silica and silica metal. Beside imparting improved mechanical strength, another important role of the silicon containing additive is the control of the phosphorus concentration in the solid diffusion source.

During doping at 1150° C., the compound $SiO_2 \cdot P_2O_5$ develops its vapors as follows:

$$SiO_2 \cdot P_2O_5 \rightarrow SiO_2 + P_2O_5 \quad (1)$$

$$P_2O_5 \rightarrow P^{4+} + O^{2-} \quad (2)$$

TABLE 3.—PROPERTIES OF SINTERED BODIES

[$SiO_2 \cdot P_2O_5 + Si_3N_4$, $SiO_2 \cdot P_2O_5 + SiO_2$ and $SiO_2 \cdot P_2O_5$ + Si metal]

| Number A | Composition $SiO_2 \cdot P_2O_5$ | Composition Additive | | Theoretical density, g./cc.[1] | Body weight (g.)[2] | Bulk density, g./cc.[3] | Phosphorus content (wt. percent)[4] | Sintering conditions[5] Temp. (° C.) | Sintering conditions[5] Atmosphere |
|---|---|---|---|---|---|---|---|---|---|
| 1 | 100 | 0 | ---- | 2.70 | 34.8 | 1.65 | 21.0 | 1,100 | |
| 2 | 70 | 30 | $Si_3N_4$ | 2.89 | 37.4 | 1.64 | 15.2 | 1,100 | |
| 3 | 50 | 50 | $Si_3N_4$ | 3.03 | 39.1 | 1.55 | 9.5 | 1,100 | Nitrogen. |
| 4 | 30 | 70 | $Si_3N_4$ | 3.18 | 41.0 | 1.62 | 6.8 | 1,200 | |
| 5 | 5 | 95 | $Si_3N_4$ | 3.39 | 43.7 | 1.43 | 1.0 | 1,200 | |
| 6 | 70 | 30 | $SiO_2$ | 2.53 | 32.6 | 1.75 | 17.3 | 1,150 | Air. |
| 7 | 5 | 95 | $SiO_2$ | 2.22 | 28.6 | 1.64 | 1.6 | 1,200 | |
| 8 | 70 | 30 | Si | 2.61 | 33.7 | 1.73 | 13.5 | 1,150 | Argon. |
| 9 | 5 | 95 | Si | 2.43 | 31.3 | 1.55 | 0.9 | 1,200 | |

[1] Calculated from theoretical densities of $SiO_2 \cdot P_2O_5$ (2.70 g./cc.), $Si_3N_4$ (3.44 g./cc.), $SiO_2$ (2.20 g./cc.) and Si (2.42 g./cc.).

[2] Powder amount for the body, 1 inch diameter and 1 inch high, with theoretical density.

[3] Bulk density of the sintered body.

[4] Phosphorus content in the sintered body.

[5] Sintering at a heating rate of 100° C./hr. for 12 hours.

While the phosphorus-silicon compound used in all examples shown in Table 3 has a composition approximating $SiO_2 \cdot P_2O_5$, the source bodies of the invention are not Of these vapors, $P_2O_5$ vapor may be further dissociated into phosphorus and oxygen ions (2). As a result, the $P^{4+}$ ion diffuses selectively into a semiconductor silicon wafer in the presence of an oxygen ion. The presence of an oxygen ion is not essential but its presence has recently been found to be very effective for phosphorus diffusion, although the reason for this is not clear. The phosphorus diffusion profile and/or the carrier concentration of phosphorus established in the doped silicon are primarily defined by the diffusion coefficient of phosphorus which behaves as a function of temperature as shown in Table 4.

Table 4. Diffusion Coefficient, D, of Phosphorus in Silicon

| Temperature (° C.) | D (cm.$^2$/sec.) |
|---|---|
| 1000 | $4\times10^{-14}$ |
| 1100 | $4\times10^{-13}$ |
| 1150 | $1\times10^{-12}$ |
| 1200 | $4\times10^{-11}$ |

Since higher concentrations of phosphorus in the solid diffusion source do not always result in better phosphorus doping in the silicon wafer, the optimum concentration should be defined in terms of the specified doping conditions such as temperature and time of doping, oxidized or unoxidized, as well as phosphorus concentration.

What is claimed is:

1. A solid phosphorus containing source body for semiconductor diffusion doping treatment, said body comprising about 5 to about 70 wt. percent of compounds of phosphorus and silicon and the balance silicon containing additives, wherein the compounds of phosphorus and silicon are selected from the group consisting of compositions of $SiO_2 \cdot P_2O_5$, $2SiO_2 \cdot P_2O_5$, and $SiO_2 \cdot 2P_2O_5$, and the silicon containing additives are selected from the group consisting of silicon nitride, silicon oxide and silicon metal.

2. A solid phosphorus containing source body for semiconductor diffusion doping treatment according to claim 1 in which the body comprises about 30 to about 70 wt. percent of compounds of phosphorus and silicon and the balance silicon nitride.

3. A solid phosphorus containing source body according to claim 2 in which the body comprises about 30 wt. percent of compounds of phosphorus and silicon and about 70 wt. percent silicon nitride.

References Cited

UNITED STATES PATENTS

| | | | |
|---|---|---|---|
| 3,732,117 | 5/1973 | Nitta et al. | 252—63.5 X |
| 3,520,831 | 7/1970 | Trap et al. | 252—500 X |
| 3,190,892 | 6/1965 | Richardson et al. | 252—63.5 X |
| 2,970,111 | 1/1961 | Hoffmann et al. | 252—500 X |

GEORGE F. LESMES, Primary Examiner

P. C. IVES, Assistant Examiner

U.S. Cl. X.R.

161—165, 193, 206; 252—63.5, 317; 106—52; 423—304, 325, 335